(12) United States Patent
Beng Keh et al.

(10) Patent No.: US 8,633,581 B2
(45) Date of Patent: Jan. 21, 2014

(54) SEMICONDUCTOR DEVICE (75) Inventors: See Beng Keh, Melaka (MY); Paulus Stefan, Zeitlarn (DE); Auburger Albert, Regenstauf (DE); Wietschorke Helmut, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 560 days.

(21) Appl. No.: 12/403,499

(22) Filed: Mar. 13, 2009

(65) Prior Publication Data

US 2010/0230799 A1    Sep. 16, 2010

(51) Int. Cl.
*H01L 23/28* (2006.01)

(52) U.S. Cl.
USPC ............... 257/690; 257/E23.06; 257/E21.599

(58) Field of Classification Search
USPC .............................. 257/690, E23.06, E21.599
See application file for complete search history.

(56) References Cited

U.S. PATENT DOCUMENTS

| | | |
|---|---|---|
| 6,717,245 B1 | 4/2004 | Kinsman et al. |
| 2002/0197771 A1 | 12/2002 | Dotta et al. |
| 2004/0201088 A1 | 10/2004 | Kim et al. |
| 2005/0048693 A1 | 3/2005 | Yoon |
| 2007/0216038 A1 | 9/2007 | Park et al. |
| 2007/0296090 A1 | 12/2007 | Hembree |
| 2008/0054423 A1 | 3/2008 | Poo et al. |
| 2008/0057622 A1* | 3/2008 | Fan ............................... 438/106 |
| 2008/0105941 A1* | 5/2008 | Chang et al. .................. 257/433 |

FOREIGN PATENT DOCUMENTS

DE    10 2006 012 755    9/2007

* cited by examiner

*Primary Examiner* — Long Pham
(74) *Attorney, Agent, or Firm* — Dicke, Billig & Czaja, PLLC (57) ABSTRACT A semiconductor device includes a carrier, a chip attached to the carrier, and an encapsulation body disposed over the chip and the carrier. An exterior surface of the semiconductor device includes an exposed peripheral edge of at least two of the carrier, the chip, and the encapsulation body.

13 Claims, 7 Drawing Sheets

SEMICONDUCTOR DEVICE

BACKGROUND

A semiconductor package provides an enclosure for one or more semiconductor chips. Semiconductor packages are employed in mobile electronic devices, including cellular telephones and other communication devices, automotive electronics, and other technology platforms.

Fabrication of semiconductor packages generally includes separating (or dicing) an individual semiconductor die from a wafer of multiple dies (or dice). After dicing, each die is picked-and-placed individually onto a carrier and electrical connections are made to the die. Some form of electrically insulating material is deposited over the die to provide a durable semiconductor package. This one-by-one (or one-at-a-time) approach to fabricating semiconductor packages has proven to be useful and effective. However, the yield of semiconductor packages is consequently constrained by the one-at-a-time fabrication approach, which can add to the average cost of each of the semiconductor packages.

For these and other reasons there is a need for the present invention.

SUMMARY

One embodiment provides a semiconductor device including a carrier, a chip attached to the carrier, and an encapsulation body disposed over the chip and the carrier. An exterior surface of the semiconductor device includes an exposed peripheral edge of at least two of the carrier, the chip, and the encapsulation body.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

In addition, while a particular feature or aspect of one embodiment may be disclosed with respect to only one of several implementations, such feature or aspect may be combined with one or more other features or aspects of the other implementations as may be desired and advantageous for any given or particular application. Furthermore, to the extent that the terms "include," "have," "with," or other variants thereof are used in either the detailed description or the claims, such terms are intended to be inclusive in a manner similar to the term "comprise." The terms "coupled" and "connected," along with derivatives may be used. It should be understood that these terms may be used to indicate that two elements cooperate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

The embodiments of a method of fabricating a semiconductor device may use various types of semiconductor chips or semiconductor substrates, among them logic integrated circuits, analog integrated circuits, mixed signal integrated circuits, sensor circuits, MEMS (Micro-Electro-Mechanical Systems), power integrated circuits, chips with integrated passives, discrete passives and so on. In general the term "semiconductor chip" as used in this application can have different meanings one of which is a semiconductor die or semiconductor substrate including an electrical circuit.

In several embodiments layers are applied to one another or materials are applied or deposited onto layers. It should be appreciated that any such terms as "applied" or "deposited" are meant to cover literally all kinds and techniques of applying layer onto each other. In one embodiment, they are meant to cover techniques in which layers are applied at once as a whole, like, for example, laminating techniques, as well as techniques in which layers are deposited in a sequential manner, like, for example, sputtering, plating, molding, chemical vapor deposition (CVD) and so on. One example for a layer to be applied is the redistribution layer (RDL). The redistribution layer can be in the form of a multilayer, in particular a multilayer including a repeating layer sequence.

The semiconductor chips may include contact elements or contact pads on one or more of their outer surfaces wherein the contact elements serve for electrically contacting the semiconductor chips. The contact elements may be made from any electrically conducting material, e.g., from a metal as aluminum, gold, or copper, for example, or a metal alloy, e.g., solder alloy, or an electrically conducting organic material, or an electrically conducting semiconductor material.

In some embodiments the semiconductor chips are covered with an encapsulant material. The encapsulant material includes any electrically insulating material like, for example, any kind of molding material, any kind of epoxy material, or any kind of resin material with or without any kind of filler materials. In special cases it could be advantageous to use a conductive encapsulant material. In the process of covering the semiconductor chips or dies with the encapsulant material, a fan-out of embedded dies is fabricated. The fan-out of embedded dies is arranged in an array having the form of a wafer and is referred to as a "re-configured wafer." However, it should be appreciated that the fan-out of embedded dies is not limited to the form and shape of a wafer but can have any size and shape and any suitable array of semiconductor chips embedded therein.

In the claims and in the following description different embodiments of a method of fabricating a semiconductor device are described as a particular sequence of processes or measures, in particular in the flow diagrams. It is to be noted that the embodiments should not be limited to the particular sequence described. Particular ones or all of different processes or measures can also be conducted simultaneously or in any other useful and appropriate sequence.

Embodiments provide a semiconductor device fabricated by picking and placing a multi-chip bar of semiconductor dice from a wafer onto a carrier, with subsequent singulation of the dice into semiconductor packages, in a manner that reduces the cost of the semiconductor packages as compared to the conventional semiconductor package fabrication approaches.

Embodiments provide placing a multi-chip bar of semiconductor dice in alignment with saw streets on a carrier, followed by electrical connection and singulation of the dice into semiconductor packages. For example, each of the semiconductor dice is connected to a portion of the carrier, and all of the dice and the carrier and the connection elements are encapsulated with an encapsulation material. Semiconductor packages are subsequently singulated from the encapsulation body.

Picking and placing a multiple chips at a time, followed by electrical connection and singulation, increases process efficiency and reduces semiconductor package processing costs. In one embodiment, an exterior surface of each of the semiconductor packages includes an exposed peripheral edge of the semiconductor chip as a result of sawing through the multi-chip bar.

Figure 1A:
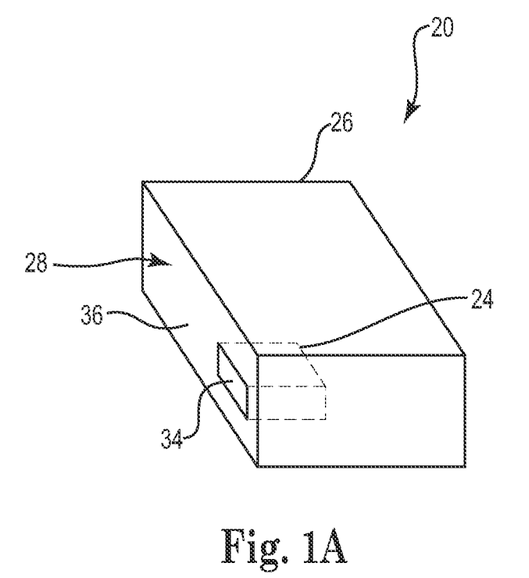
FIG. 1A is a perspective view and FIG. 1B is a top view of a semiconductor device according to one embodiment.
Figure 1B:
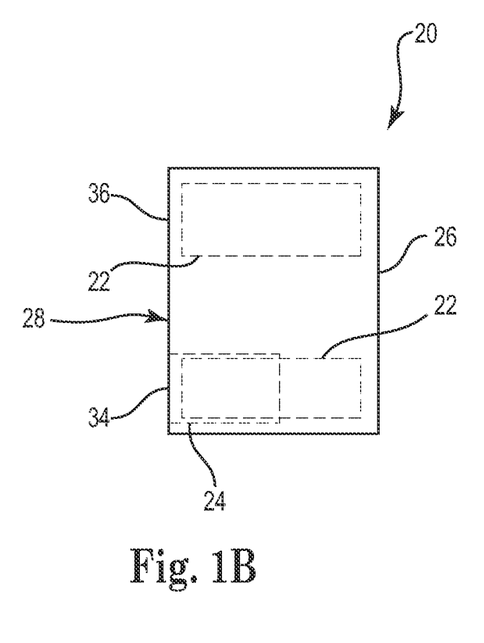

FIG. 1A is a perspective view and FIG. 1B is a top view of a semiconductor device 20 according to one embodiment. Semiconductor device 20 includes a carrier 22, a chip 24 attached to carrier 22, and an encapsulation body 26 disposed over carrier 22 and chip 24. In one embodiment, an exterior surface 28 of semiconductor device 20 includes an exposed peripheral edge 34 of chip 24 and a peripheral edge 36 of the sawn/singulated encapsulation body 26. FIG. 1B illustrates that boundaries of carrier 22 are covered by encapsulation body 26. Thus, one embodiment provides peripheral edges of at least two of carrier 22, chip 24, and encapsulation body 26 are exposed on exterior surface 28 of semiconductor device 20.

Embodiments provide picking and placing a multi-chip bar of semiconductor dice onto a carrier, and sawing the multi-chip bar in a manner that results in a silicon edge of each of the semiconductor dice being exposed on an exterior surface of each semiconductor package, as described below.

Figure 2:
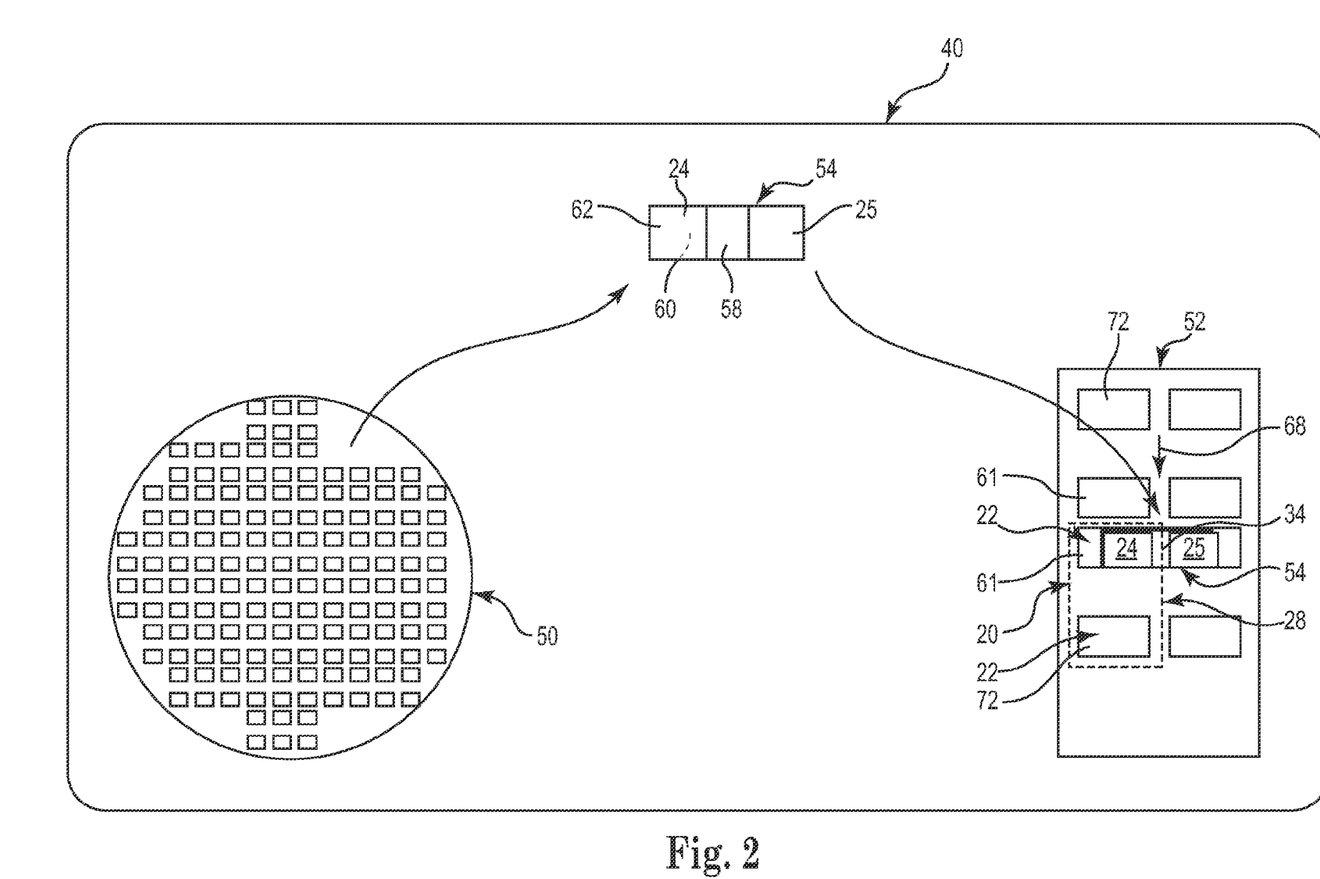
FIG. 2 is a schematic representation of a process including removing a multi-chip bar from a wafer for placement on a carrier according to one embodiment.

FIG. 2 is a schematic representation of a process 40 for fabricating semiconductor device 20 according to one embodiment. Process 40 includes a wafer 50 fabricated to include multiple semiconductor chips, a carrier frame 52 to which the chips are connected, and a multi-chip bar 54 separated from wafer 50 for placement on carrier frame 52.

In one embodiment, multi-chip bar 54 (bar 54) includes a first semiconductor chip 24 and a second semiconductor chip 25 connected by wafer material 58. Wafer material 58 includes silicon, or layers of silicon and dielectric, or multiple layers of semiconductor material. In one embodiment, wafer material 58 includes sacrificial silicon wafer material that is sawed through or diced during the singulation process. In one embodiment, bar 54 is a two-chip bar including chips 24, 25. In other embodiments, bar 54 includes more than two chips, for example four chips, eight chips, or a dozen or more chips.

Chip 24 includes a first face 60 configured for attachment to a chip pad 61 of carrier frame 52 and a second face 62 opposite face 60 that is configured for wire bonding to a landing pad 72 of carrier frame 52. In one embodiment, wafer material 58 is disposed and aligned with a saw street 68 of carrier frame 52.

Carrier frame 52 includes multiple chip pads 61 and landing pads. For example, bar 54 (and dice 24, 25) is attached to chip pad(s) 61 of carrier frame 52 and each of the dice 24, 25 is connected to one of the landing pads 72 of carrier frame 52. Thus, the carrier frame 52 and chip 24 illustrated in FIG. 2 are ready for wire bonding and encapsulation prior to singulation into a semiconductor package.

Figure 3A:
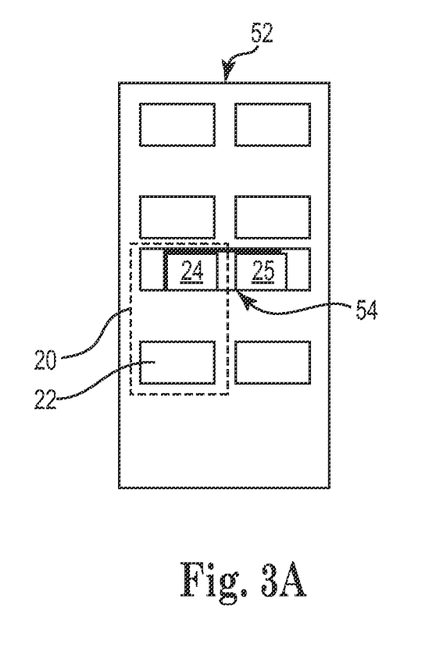
FIG. 3A is a top view of a two-chip bar placed on pads of a carrier according to one embodiment.

FIG. 3A is a top view of multi-chip bar 54 connected to carrier frame 52. A package outline of device 20 is dotted around chip 24 for descriptive purposes to illustrate where device 20 is to be separated from carrier frame 52.

Figure 3B:
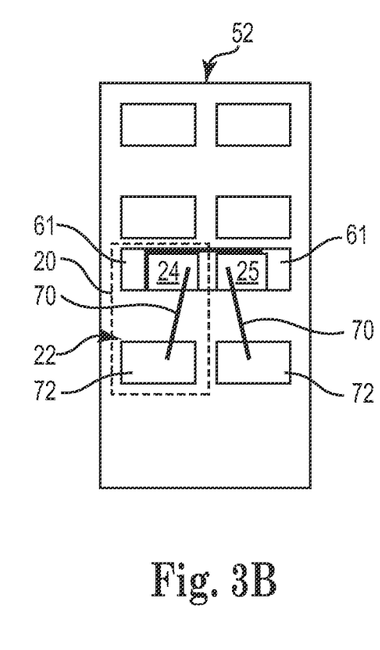
FIG. 3B is a top view of connection elements connected between each chip of the two-chip bar illustrated in FIG. 3A and a landing pad on the carrier according to on embodiment.

FIG. 3B is a top view of multi-chip bar 54 attached to carrier frame 52 and including contact elements 70 extending between chip 24 and landing pad 72 and between chip 25 and landing pad 72. In one embodiment, bar 54 is first connected to frame 52 (e.g., each chip 24, 25 is bonded to a chip pad 61 of carrier frame 52), and chips 24, 25 are subsequently electrically connected to a landing pads 72 of carrier frame 52 with connection elements 70.

In one embodiment, bar 54 is connected to frame 52 with an electrically conducting bond material, such as an adhesive. Suitable connection elements 70 include bond wires, clips, strips, metal traces, or other suitable forms of electrical connection between chips 24, 25 and wire bonding landing pads 72.

Figure 3C:
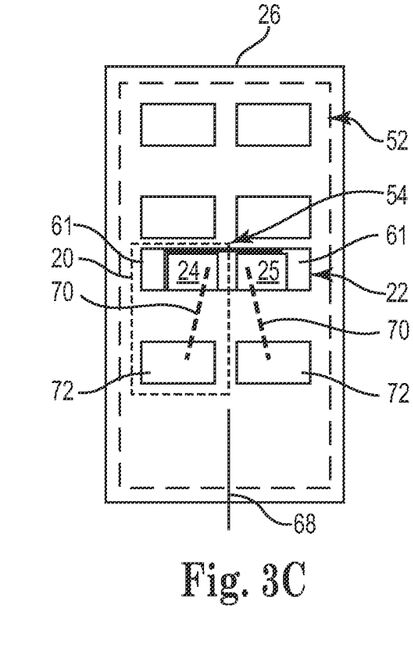
FIG. 3C is a top view of encapsulation material disposed over the chips, the connection elements, and the carrier illustrated in FIG. 3B according to one embodiment.

FIG. 3C is a top view of bar 54 attached to carrier frame 52 and encapsulated by encapsulation body 26. Again, a proposed boundary of the singulated semiconductor device 20 is shown by a dotted outline to illustrate where the device 20 will be separated from carrier frame 52. In one embodiment, two-chip bar 54 is sawn along saw street 68, which exposes the peripheral edge 34 of chip 24 (FIG. 1A) by sawing or dicing or cutting through wafer material 58 and encapsulation body 26, and thus providing the semiconductor device 20 illustrated in FIGS. 1A and 1B.

Carrier 22 includes any suitable carrier for semiconductor package fabrication. Suitable carriers include leadframes in general, metal leadframes, metal substrates, laminates of suitable substrates including at least one metallized layer, or other suitable carriers. In one embodiment, carrier 22 is provided as a leadless leadframe including chip pad(s) and wire bonding pad(s) suitable for fabrication into a thin small leadless package (TSLP).

In on embodiment, semiconductor chip 24 is a logic chip, or a memory chip, or another form of a suitable semiconductor chip. Suitable semiconductor chips include integrated circuits configured as logic circuits, control circuits, microprocessors or microelectrical-mechanical components, memory chips, power semiconductor chips such as power transistors, power diodes, insulated gate bi-polar transistors, vertical chips configured such that electric current flows in the Z-direction between main faces 60/62, embedded chips, or flip chips. In one embodiment, chip 24 is provided as a vertical power transistor having a first electrode connected to one of a source/drain on first main face 60 and a second electrode connected to the other of the source/drain on second main face 62.

Encapsulation body 26 includes material that is generally non-electrically conducting. Suitable material for encapsulation body 26 includes polymers and/or epoxies. In one embodiment, a dielectric or other layer is deposited over chip 24 and suitably opened for connection prior to encapsulation with encapsulation body 26. In one embodiment, encapsulation body 26 is deposited over the upper or top surfaces of chip 24 and carrier 22. In another embodiment, encapsulation body 26 completely surrounds carrier 22 and chip 24. In one embodiment, encapsulation body 26 is compression molded over chip and leadframe. In one embodiment, encapsulation body 26 is injection molded over chip and leadframe.

Figure 4:
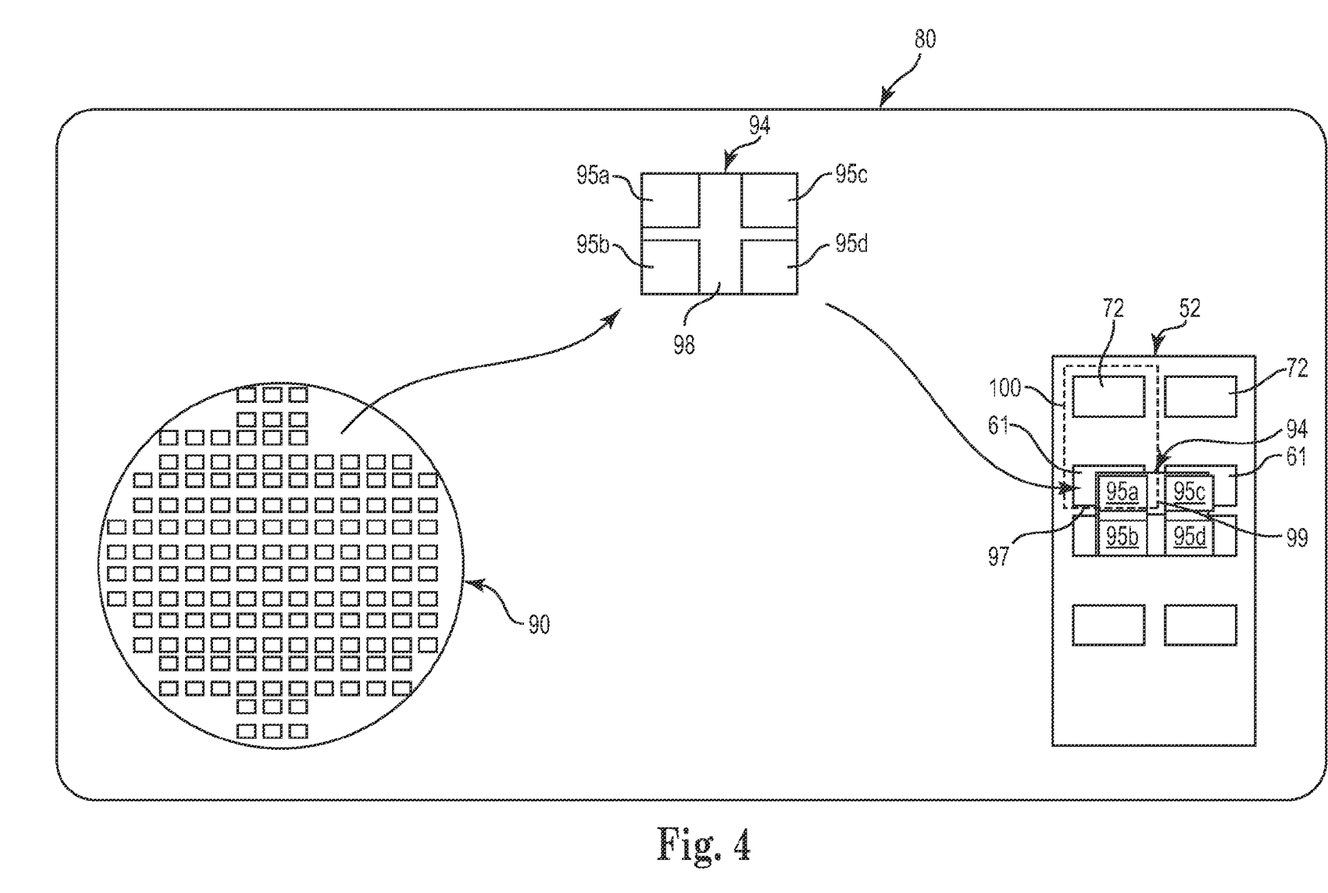
FIG. 4 is a schematic representation of a process including removing a four-chip bar from a wafer for placement on a carrier according to one embodiment.

FIG. 4 is a schematic illustration of a process 80 for fabricating a semiconductor device according to another embodiment. In one embodiment, process 80 includes a wafer 90 providing multiple semiconductor chips from which a multi-chip bar 94 of chips is removed and attached to carrier frame 52. In one embodiment, multi-chip bar 94 includes four chips 95a, 95b, 95c, 95d separated by sacrificial silicon material 98. Multi-chip bar 94 is attached to carrier frame 52 such that chip 95a and each of the other respective chips 95b, 95c, 95d is attached to a respective chip pad 61 of carrier frame 52. Chips 95a-95d are subsequently connected electrically to landing pads 72, encapsulated with an encapsulation body, and singulated into multiple discrete semiconductor packages.

In one embodiment, sacrificial silicon material 98 between chips 95a-95d is aligned with saw streets of carrier frame 52. In general, the saw streets of carrier frame 52 are defined by the spaces between chip pads 61 and landing pads 72. Singulating along the saw streets enables the selective separation of each of the chips 95a-95d, with each chip attached to its chip pad 61.

A boundary (dotted outline) of semiconductor device 100 is imposed on carrier frame 52 to illustrate a location of exterior surfaces of semiconductor device 100 after singulation. For example, chip 95a is singulated along a width boundary 97 and along a length boundary 99. In one embodiment, singulation of semiconductor device 100 results in a peripheral edge of chip 95a being exposed on two exterior surfaces of device 100, for example a first peripheral edge is exposed on width boundary 97 and a second peripheral edge is exposed on length boundary 99.

Figure 5A:
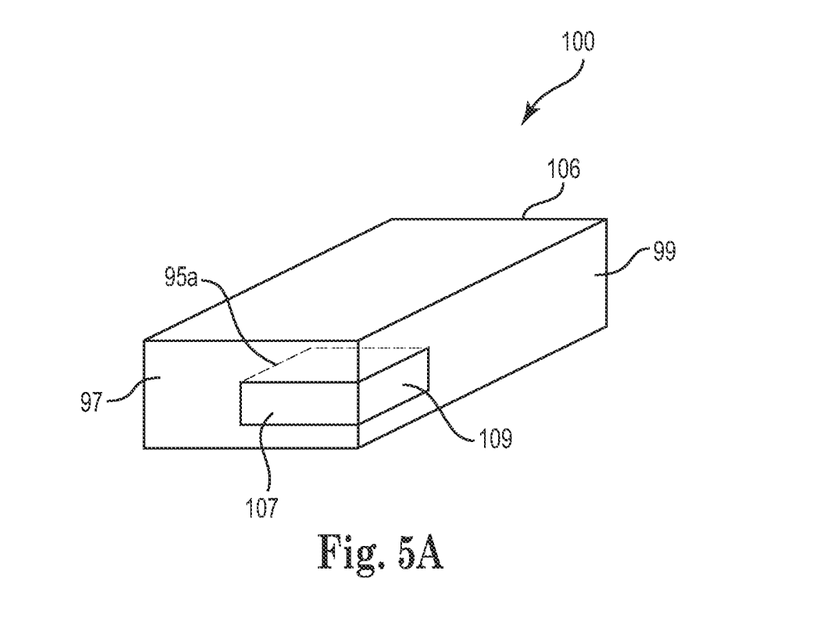
FIG. 5A is a perspective view and FIG. 5B is a top view of a semiconductor device fabricated and singulated from the process illustrated in FIG. 4 according to one embodiment.
Figure 5B:
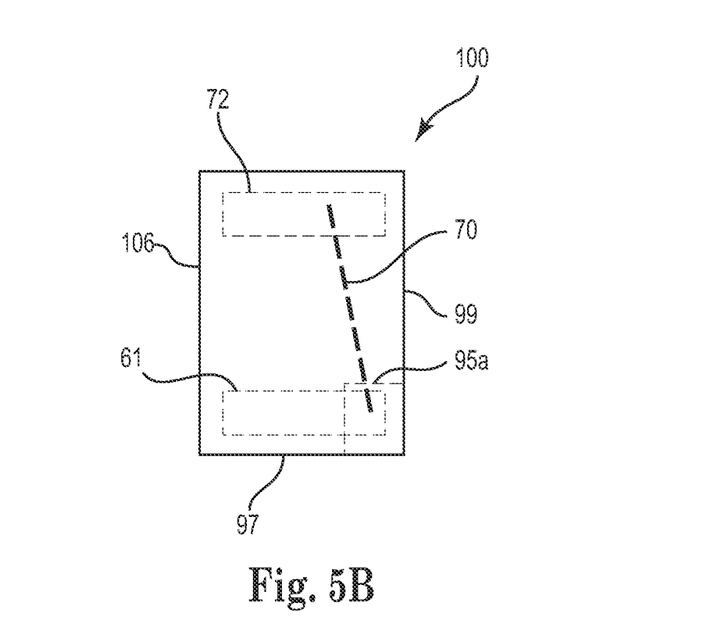

FIG. 5A is a perspective view and FIG. 5B is a top view of semiconductor device 100 after electrical connection, encapsulation, and singulation. In one embodiment, chip 95a is attached to chip pad 61 and electrically connected to wire bond landing pad 72 by connection element 70. For ease of illustration, connection element 70 and pad 61 are not shown in FIG. 5A.

Semiconductor device 100 is singulated or diced or sawn such that a peripheral edge 107 of chip 95a is exposed on exterior surface 97, and a peripheral edge 109 of chip 95a is exposed on exterior surface 99. The sacrificial silicon material 98 (FIG. 4) has been severed to expose peripheral edges 107, 109 on exterior surfaces 97, 99 of semiconductor device 100.

In one embodiment, multi-chip bar 94 (FIG. 4) is aligned on saw streets of carrier frame 52 (FIG. 4) such that after singulation the chip pads 61 of carrier frame 52 are encapsulated by encapsulation material 106. Similarly, connection element 70 is encapsulated by encapsulation material 106. The peripheral edges of encapsulation body 106 and the peripheral edges 107, 109 of chip 95a are exposed along the respective exterior surfaces 97, 99 of semiconductor device 100.

Figure 6A:
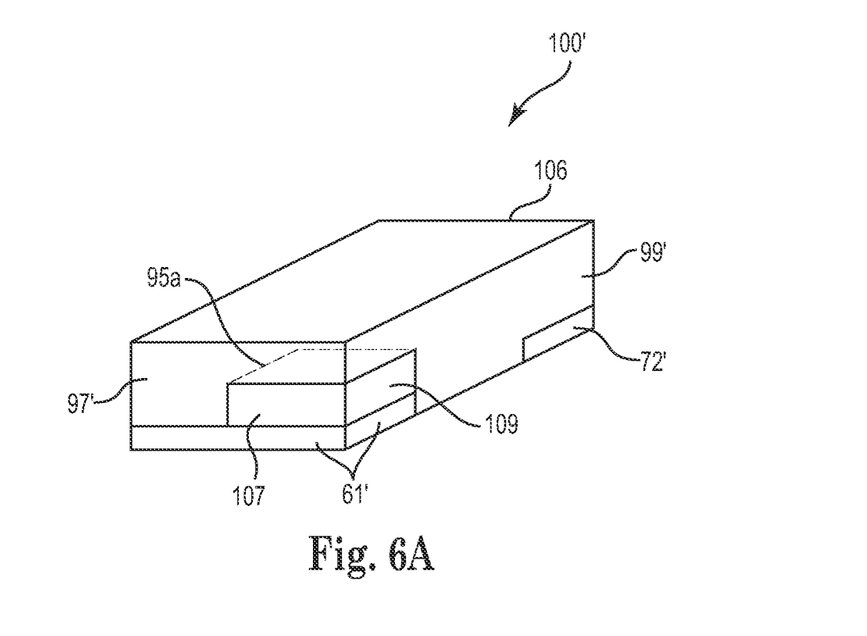
FIG. 6A is a perspective view and FIG. 6B is a top view of a singulated semiconductor package according to another embodiment.
Figure 6B:
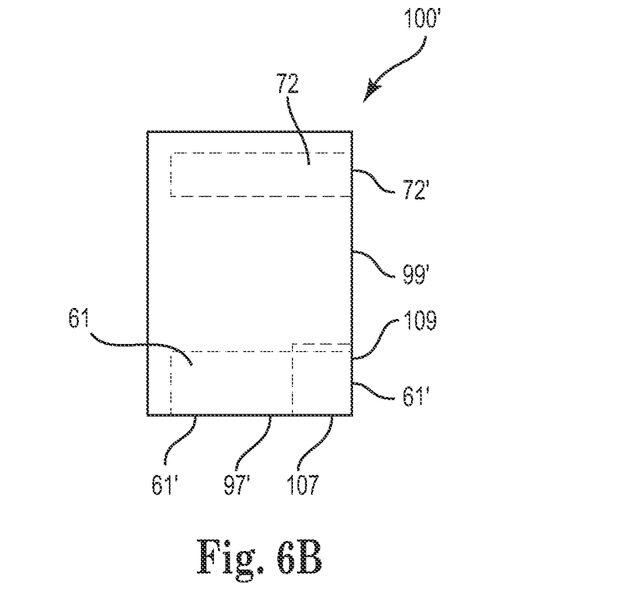

FIG. 6A is a perspective view and FIG. 6B is a top view of a semiconductor device 100' according to one embodiment. With additional reference to FIG. 4, silicon material 98 is aligned with saw streets of carrier frame 52 to provide space for sawing between semiconductor chips 95a-95d. In one embodiment, multi-chip bar 94 is imperfectly aligned on saw streets, or saw streets are widened in a manner that exterior surface 97' of device 100' includes an exposed peripheral edge 107 of chip 95a and an exposed peripheral edge 61' of chip pad 61. It is to be understood that a peripheral edge of encapsulation material 106 had already been exposed on a boundary of semiconductor device 100'. In a similar manner, exterior surface 99' includes an exposed peripheral edge 109 of chip 95a, an exposed peripheral edge 61' of chip pad 61, and an exposed peripheral edge 72' of landing pad 72. It is generally not desirable to expose the peripheral edges 61' and 72' of the carrier frame 52. However, during fabrication of semiconductor devices 100' it is occasionally possible to expose a peripheral edge of the carrier in this manner in a way that does not detract from the performance of the semiconductor device.

Figure 7:
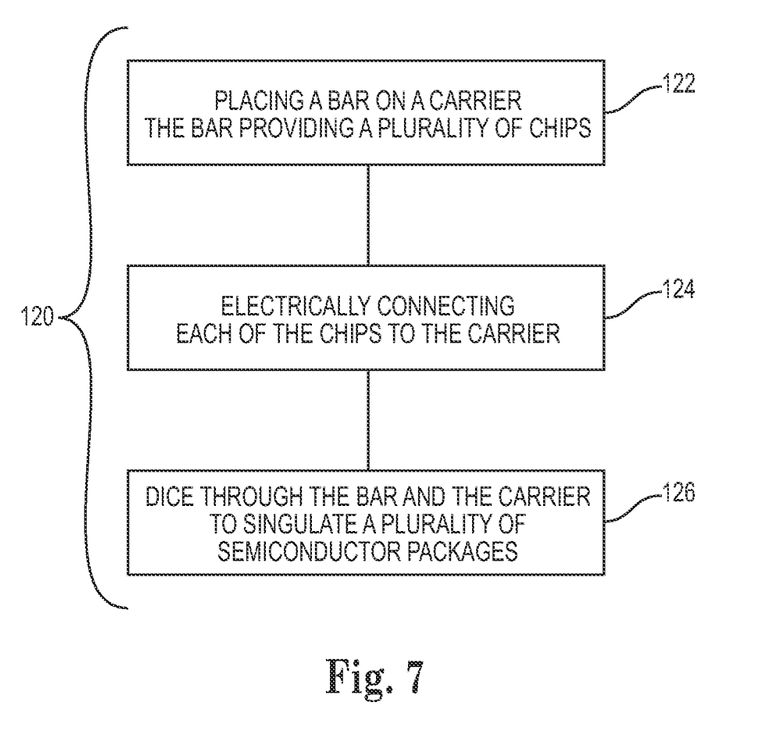
FIG. 7 is a block diagram of a process for manufacturing a semiconductor device according to one embodiment.

FIG. 7 is a block diagram of a process 120 for fabricating the above-described semiconductor devices according to one embodiment. Process 120 includes placing a bar on a carrier at 122, where the bar provides a plurality of monolithic or integral semiconductor chips. Suitable bars include the multi-chip bars described above having two or more chips commonly connected with sacrificial silicon material. At 124, each of the chips is electrically connected to the carrier. For example, a first face of the chip is connected to a chip pad of the carrier and a second opposing face of the chip is wire bonded to a wire bonding landing pad on the carrier, as described above. At 126, the bar and the carrier are sawed through to singulate multiple discrete semiconductor packages. In one embodiment, the sawing of the bar and the carrier to singulate the semiconductor packages is conducted in a single pass of a singulation tool. In one embodiment, the semiconductor packages are singulated by sawing on a first side of the encapsulation body, turning encapsulation body over, and sawing through a second opposing side to fully singulate the semiconductor package.

With reference to wafer 50 in FIG. 2 and wafer 90 in FIG. 4, typical saw street dimensions for wafer-based chips is on the order of about seventy microns. The typical saw street dimension for saw streets provided on a leadframe is about eighty microns. It is desirable to provide a sufficient amount of silicon material 58/98 between chips on the multi-chip bar 54, 94 to accommodate an increase in the size of the saw street when the chips are attached to a leadframe carrier. Increasing the lateral dimension of the saw street naturally decreases the number of chips available for use from the wafer 50, 90. Even so, embodiments provided herein enable picking and placing multiple chips at a time in a manner that results in semiconductor package fabrication savings of between about 15-60 percent.

For example, increasing the saw street size from seventy microns to eighty microns will increase the cost of each semiconductor chip (e.g., the wafer will yield fewer chips). It will be understood that the increase in the chip cost is greater for smaller chips, which see a greater percentage loss in chip size for increasing the saw street from seventy microns to eighty microns. The die bonding cost for the chips is unchanged since the bonding material is essentially unchanged.

For "small" semiconductor chips identified as D1436 and available from Infineon, it has been discovered and described herein that bonding two chips at once as illustrated in FIG. 2 with two-chip bar 54 results in a 16% savings over conventional one-by-one chip bonding during semiconductor package fabrication.

For the small semiconductor chips identified as D1436 and available from Infineon, it has been discovered and described herein that bonding four-chip bar 94 as illustrated in FIG. 4 provides about a 43% savings over the conventional one-by-one die bonding of the smallest available semiconductor chips.

Larger semiconductor chips are less affected by the saw street size. In this regard, the increase in the cost of large chips when increasing the saw street size on the wafer is diminished as compared to the example offered above for the small chips.

For "large" semiconductor chips identified as D1424 and available from Infineon, it has been discovered and described herein that bonding the two-chip bar as described above in FIG. 2 provides about a 32% savings increase over the conventional one-by-one die bonding.

For the large semiconductor chips identified as D1424 and available from Infineon, it has been discovered and described herein that bonding the four-chip bar 94 as described above in FIG. 4 provides about a 54% savings over the conventional one-by-one die bonding for the largest (D1424) style of semiconductor chips.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments of individual packages singulated from a larger assembly of a multi-chip bar, as discussed herein. Therefore, it is intended that this invention be limited only by the claims and the equivalents thereof.

What is claimed is:

1. A method of manufacturing a semiconductor device, the method comprising:
   placing a bar comprising a plurality of chips on a carrier;
   electrically connecting each of the chips to the carrier;
   dicing through the bar and the carrier and singulating a plurality of semiconductor packages; and
   exposing a peripheral edge of at least the one of the plurality of chips on a common plane with an exterior planar surface of the semiconductor device.

2. The method of claim 1, further comprising:
   encapsulating the bar and the carrier with encapsulation material.

3. The method of claim 2, comprising dicing through the bar and the encapsulation material.

4. The method of claim 3, comprising exposing an edge of at least the bar on the exterior planar surface of the semiconductor device.

5. The method of claim 2, comprising sawing through at least two of the bar and the carrier and the encapsulation material.

6. The method of claim 5, comprising sawing at least two of the bar and the carrier and the encapsulation material in one pass of a singulation tool.

7. The method of claim 5, wherein at least two of the bar and the carrier and the encapsulation material comprise exposed edges disposed on a second common plane.

8. The method of claim 1, wherein placing the bar comprising the plurality of chips on the carrier comprises aligning a saw street of the bar with a saw street of the carrier.

9. The method of claim 1, comprising singulating at least two semiconductor packages, each semiconductor package comprising at least one of the plurality of chips electrically connected to a separated segment of the carrier.

10. A method of manufacturing a semiconductor device, the method comprising:
    placing a bar comprising a plurality of chips on a carrier;
    electrically connecting each of the chips to the carrier;
    encapsulating the bar and the carrier with encapsulation material; and
    sawing through the bar and the encapsulation material, including exposing edges of at least one of the plurality of chips and the encapsulation material disposed on a first common edge plane.

11. The method of claim 10, wherein sawing the bar and the encapsulation material comprises one pass of a singulation tool.

12. The method of claim 10, wherein sawing the bar and the encapsulation material comprises sawing on a first side of the encapsulation body, turning the encapsulation body over, and sawing through a second opposing side to fully singulate the semiconductor package.

13. The method of claim 10, further comprising exposing edges of the at least one of the plurality of chips and the encapsulation material disposed on a second common plane.

* * * * *

UNITED STATES PATENT AND TRADEMARK OFFICE
CERTIFICATE OF CORRECTION

PATENT NO. : 8,633,581 B2  
APPLICATION NO. : 12/403499  
DATED : January 21, 2014  
INVENTOR(S) : See et al.

Page 1 of 1

It is certified that error appears in the above-identified patent and that said Letters Patent is hereby corrected as shown below:

On the title page of the Patent, under Item (12), please delete the following:

"Beng Keh et al." and substitute -- See et al. --

Item (75), please delete the following:

"Inventors: See Beng Keh (MY); Paulus Stefan (DE); Auburger Albert (DE); Wietschorke Helmut (DE)"

And insert:

-- Inventors: Beng Keh See (MY); Stefan Paulus (DE); Albert Auburger (DE); Helmut Wietschorke (DE) --

Signed and Sealed this  
Seventh Day of June, 2016

Michelle K. Lee  
*Director of the United States Patent and Trademark Office*